(12) United States Patent
Marschalkowski et al.

(10) Patent No.: US 9,564,890 B2
(45) Date of Patent: Feb. 7, 2017

(54) SYSTEM-ON-CHIP WITH DC-DC CONVERTERS

(71) Applicant: ZENTRUM MIKROELEKTRONIK DRESDEN AG, Dresden (DE)

(72) Inventors: Eric Marschalkowski, Inning am Ammersee (DE); Ed Lam, Fremont, CA (US); Richard Maria Schmitz, San Tan Valley, AZ (US)

(73) Assignee: IDT Europe GmbH, Dresden (DE)

( * ) Notice: Subject to any disclaimer, the term of this patent is extended or adjusted under 35 U.S.C. 154(b) by 83 days.

(21) Appl. No.: 14/442,416

(22) PCT Filed: Nov. 14, 2013

(86) PCT No.: PCT/US2013/070005
§ 371 (c)(1),
(2) Date: May 13, 2015

(87) PCT Pub. No.: WO2014/078482
PCT Pub. Date: May 22, 2014

(65) Prior Publication Data
US 2016/0277020 A1    Sep. 22, 2016

Related U.S. Application Data

(60) Provisional application No. 61/726,208, filed on Nov. 14, 2012.

(51) Int. Cl.
*H03B 1/00* (2006.01)
*H03K 3/00* (2006.01)
(Continued)

(52) U.S. Cl.
CPC ............. *H03K 17/687* (2013.01); *G06F 1/324* (2013.01); *G06F 1/3296* (2013.01); *H02M 1/08* (2013.01);
(Continued)

(58) Field of Classification Search
USPC .................................................. 327/530–532
See application file for complete search history.

(56) References Cited

U.S. PATENT DOCUMENTS 5,592,118 A * 1/1997 Wilmot .................. F02P 7/035
257/E29.023
8,009,090 B2 * 8/2011 Vishin ..................... G01S 19/34
342/357.63

(Continued)

OTHER PUBLICATIONS

International Search Report for PCT/US2013/070005 dated Feb. 14, 2014.

(Continued)

*Primary Examiner* — Adam Houston
(74) *Attorney, Agent, or Firm* — Heslin Rothenberg Farley & Mesiti P.C.

(57) ABSTRACT

A System-on-Chip includes a controller for generating a switching signal for driving a switching element of a power stage of a switched power converter. The power stage generates an output voltage according to the switching signal and an input voltage by the switching element. The controller is located on the same chip as the System-on-Chip and wherein the output voltage is generated for powering a supply domain of the System-on-Chip.

21 Claims, 5 Drawing Sheets

(51) Int. Cl.
    *H03K 17/687*    (2006.01)
    *G06F 1/32*    (2006.01)
    *H02M 3/157*    (2006.01)
    *H02M 7/00*    (2006.01)
    *H02M 1/08*    (2006.01)
    *H02M 3/04*    (2006.01)
    *H03K 7/08*    (2006.01)
    *H02M 1/00*    (2006.01)

(52) U.S. Cl.
    CPC ............... *H02M 3/04* (2013.01); *H02M 3/157* (2013.01); *H02M 7/003* (2013.01); *H03K 7/08* (2013.01); *H02M 2001/0009* (2013.01); *Y02B 60/1217* (2013.01); *Y02B 60/1285* (2013.01)

(56) References Cited

U.S. PATENT DOCUMENTS

| | | | | |
|---|---|---|---|---|
| 9,423,811 | B2* | 8/2016 | Kobayashi | H02M 3/158 |
| 2006/0001408 | A1* | 1/2006 | Southwell | H02M 3/1584 |
| | | | | 323/282 |
| 2006/0055388 | A1* | 3/2006 | Tang | H02M 3/1584 |
| | | | | 323/284 |
| 2006/0132110 | A1* | 6/2006 | Tang | H02M 3/157 |
| | | | | 323/282 |
| 2007/0013350 | A1* | 1/2007 | Tang | H02M 3/1584 |
| | | | | 323/237 |
| 2007/0200538 | A1* | 8/2007 | Tang | H02M 3/157 |
| | | | | 323/237 |
| 2009/0296426 | A1 | 12/2009 | Jones | |
| 2010/0037188 | A1 | 2/2010 | Jamann et al. | |
| 2010/0318816 | A1 | 12/2010 | Chi et al. | |
| 2011/0093733 | A1 | 4/2011 | Kruglick | |
| 2011/0260783 | A1 | 10/2011 | Kawasaki | |
| 2012/0299564 | A1* | 11/2012 | Howes | G05F 1/575 |
| | | | | 323/281 |
| 2016/0094129 | A1* | 3/2016 | Schmitz | H02M 3/158 |
| | | | | 323/271 |
| 2016/0126840 | A1* | 5/2016 | Kelly | H02M 1/08 |
| | | | | 323/271 |
| 2016/0154449 | A1* | 6/2016 | Lim | G06F 1/324 |
| | | | | 713/322 |
| 2016/0216752 | A1* | 7/2016 | Kim | G06F 1/329 |
| 2016/0233776 | A1* | 8/2016 | Nielsen | H02M 3/33546 |
| 2016/0261183 | A1* | 9/2016 | Kelly | H02M 3/157 |

OTHER PUBLICATIONS

National Examination Report issued for corresponding Taiwanese Patent Application No. 102141544 dated Jul. 6, 2015, with English translation.

\* cited by examiner

SYSTEM-ON-CHIP WITH DC-DC CONVERTERS

CROSS REFERENCE TO RELATED APPLICATIONS

This application is a national stage filing under section 371 of International Application No. PCT/US2013/070005, filed on Nov. 14, 2013, and published in English on May 22, 2014 as WO 2014/078482 A1, which claims priority to U.S. Provisional Application No. 61/726,208 filed on Nov. 14, 2012, the entire content of said applications being hereby incorporated herein by reference.

FIELD OF THE INVENTION

The present disclosure relates to a System-on-Chip (SoC) with power converters.

BACKGROUND OF THE INVENTION

Cores of System-on-Chip are usually powered by power converters located outside the System-on-Chip on a separate integrated circuit. FIG. 1 shows a System-on-Chip 11, wherein the chip boundary is indicated by a dotted line. The System-on-Chip 11 comprises a plurality of cores 12 (core-1, . . . , core-n) wherein each core is powered by a separate power converter 13 of a plurality of power converters. Alternatively, each core may share a power converter with a number of different cores. It can be observed that each power converter 13 comprises a switchable power stage 16, a driver 15 and a controller 14, each located outside the System-on-Chip. Each power converter 13 is a switched DC-DC converter. Each power converter comprises a plurality of phases per power stage 16 and controller 14. Each controller 14 implements a control law for determining a control signal for controlling the driver 15 which drives the power stage 16 by a digital pulse width modulation (DPWM) signal. The driver comprises a pulse width modulator generating the DPWM signal for switching the switchable power stage. The control signal generated for controlling the driver is a duty ratio defining a duty cycle of the DPWM signal. The duty ratio and repetition rate might be regulated on cycle to cycle bases. Furthermore, the System-on-Chip comprises a plurality of power rails (rail-1, rail-2, rail-x), each comprising a power rail chip interface 110. A power rail connects a power converter 13 with a core 12. Furthermore, means for dynamic voltage and frequency scaling are provided on the System-on-Chip 18 that are connected to each controller 14 of a power converter 13 via a slow peripheral control-bus 19 from control bus chip interface 111 onwards. The controller processes the information provided by the means for dynamic voltage and frequency scaling for determining the control signal. The slow peripheral control-bus 19 is located outside the System-on-Chip.

BRIEF SUMMARY OF THE INVENTION

The present invention relates to a System-on-Chip comprising a controller for generating a switching signal for driving a switching element of a power stage of a switched power converter, the power stage generating an output voltage according to the switching signal and an input voltage by means of the switching element, wherein the controller is located on the same chip as the System-on-Chip and wherein the output voltage is generated for powering a supply domain of the System-on-Chip. Moreover, the output voltage may be generated for powering additional rails not on the System-on-Chip.

Having the controller on the same silicon as the SoC itself has the advantage of an easier and faster interface between the load and the controller.

In one embodiment the supply domain comprises a core inside the System-on-Chip. Hence, the controller is located on the same chip as the core.

In one embodiment the core is connected to a means for dynamic voltage and frequency scaling that is connected to the controller of the power converter. As the controller of the power converter is located on the same chip as the System-on-Chip the means for dynamic voltage and frequency scaling are connected to the controller via a fast on-chip control bus.

In one embodiment the driver and the power stage of the power converter is implemented as a separate integrated circuit.

Alternatively, the driver of the power converter may be located on the same chip as the plurality of cores. Specifically, the driver may be stacked on top of the chip.

In one embodiment the supply domain comprises the controller. Hence, the controller does not need a separate power supply.

The present disclosure further relates to a SoC comprising bidirectional communications and control for a power converter with a controller integrated within a SoC. The SoC can be a micro-controller with external memory and separate other ICs or a standalone SoC. A common interface is provided to establish bidirectional communications for a plurality of controllers inside the SoC, possibly as well as to an external controller outside the SoC. Furthermore a power interface is provided for each controller to establish a bidirectional communication between a controller and/or a power stage the controller is controlling. Furthermore, a supervisory module inside the SoC may control whether analog or digital signals from a controller inside the SoC may be provided to external power stage in order to maintain a regulated power control.

One application is a SoC with just one supply domain. In this case the DCDC controller resides on the same silicon and supply domain as the SoC. Another application is a SoC with multiple supply domains where each supply domain can have an own DCDC controller on the same supply domain or a master supply domain has the controller for more than just one supply domain. Another application is where the system has a master SoC with separate ICs on separate silicon substrates. In this case the integrated DCDC controller on the master SoC will enable the master SoC to control the complete system power management by having the DCDC controllers for the whole system integrated on the master SoC. In another application the supervisory function is a separate cell supervising the individual DCDC controllers whether inside or outside the SoC. Communications can be sent from the DCDC controllers to supervisory or to other DCDC controllers. The controllers then directly communicate/drive the external power.

BRIEF DESCRIPTION OF THE DRAWINGS

Reference will be made to the accompanying drawings, wherein.

DETAILED DESCRIPTION OF THE INVENTION

Figure 1:
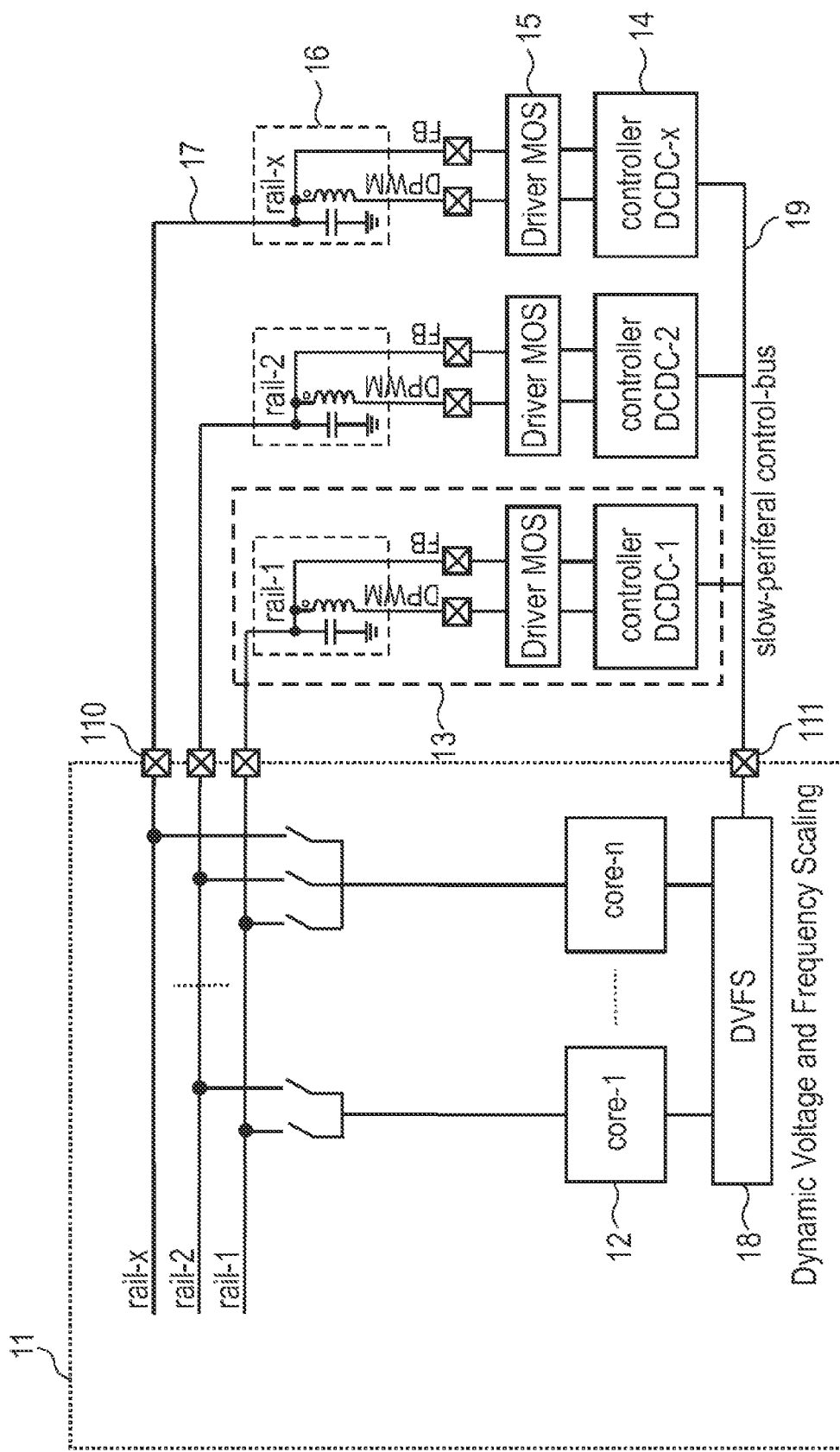
FIG. 1 shows a SoC comprising a plurality of cores inside the SoC and a plurality of power converters completely outside the SoC.
Figure 2:
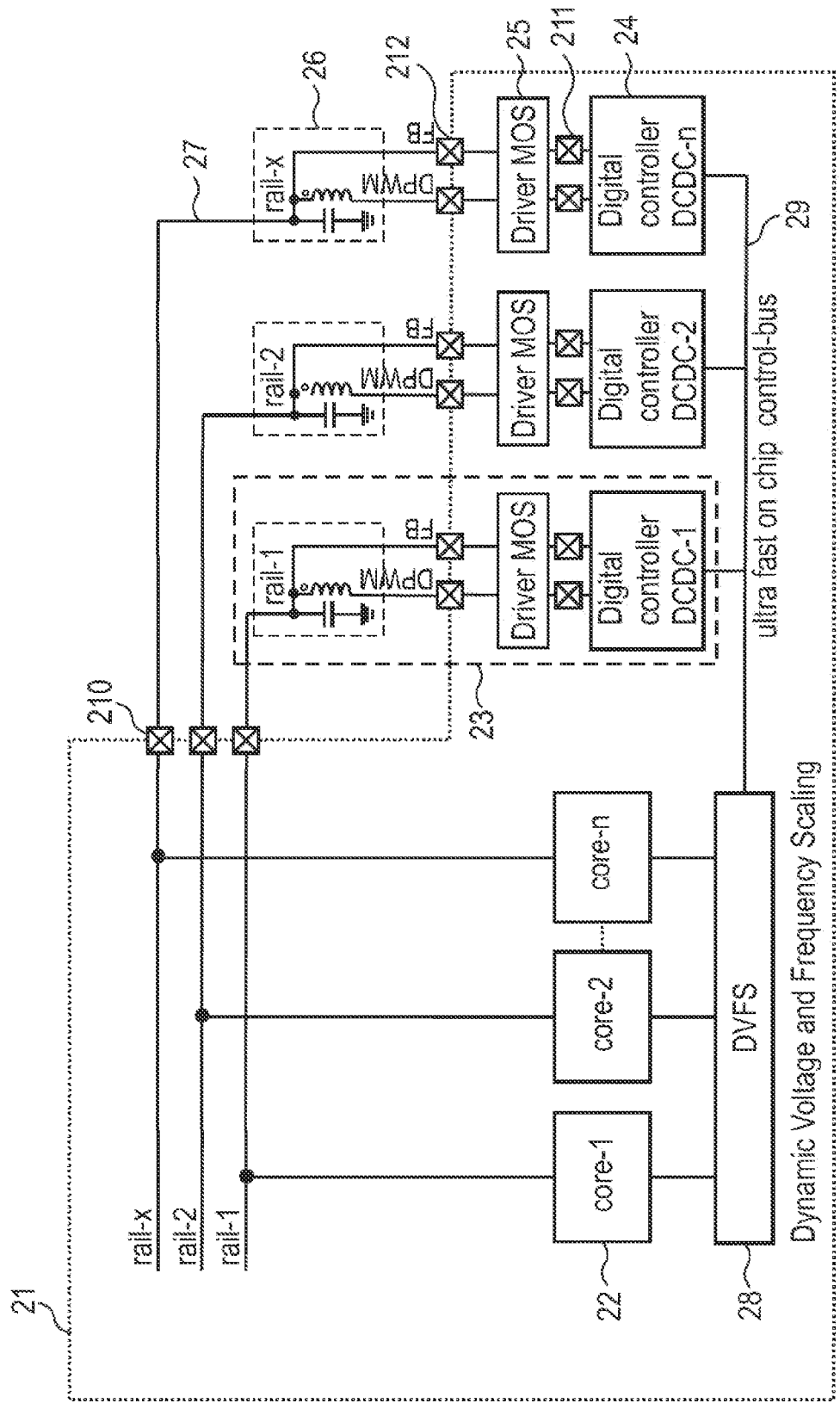
FIG. 2 shows a SoC comprising a plurality of cores inside the SoC and a plurality of power converters, each comprising a controller inside the SoC.

FIG. 2 shows a System-on-Chip comprising a plurality of cores 22 (core-1, ..., core-n), wherein each core 22 is powered by a separate power converter 23 of a plurality of power converters. Each power converter 23 is a switched DC-DC converter comprising a switchable power stage 26, a driver 25 and a digital controller 24. Each controller 24 implements a control law for determining a control signal for controlling its driver 25 that drives a switchable power stage 26.

It can be observed that each controller 24 is on the same chip as the System-on-Chip 21 that comprises the plurality of cores 22. Hence, each controller 24 is a fully integrated digital controller.

Furthermore, each core 22 is connected to a means for dynamic voltage and frequency scaling 28. The means for dynamic voltage and frequency 28 is connected to each digital controller of a power converter via an ultra-fast on-chip control bus 29. Each driver 25 is stacked on top of the chip. A driver-control-interface 211 is provided for connecting each digital controller 24 to the driver 25 it is controlling. Each driver 25 comprises a pulse width modulator generating a DPWM signal for switching each switchable power stage. The control signal generated for controlling the driver is a duty ratio defining a duty cycle of the DPWM signal. The duty ratio and repetition rate might be regulated on cycle to cycle bases. The DPWM signal is provided to a switchable power stage 26 via a driver—power stage interface 212 that is located on the chip boundary. Furthermore, the System-on-Chip comprises a plurality of power rails (rail-1, rail-2, rail-x), each comprising a power rail chip interface 210. Each power rail 17 connects a power converter 23 with a core 22.

This embodiment allows for a "cool-silicon" approach while having optimized power rails 27 for each core 22. As the ratings per rail are reduced, the external components can be made smaller. The integration of a controller inside the SoC results in a faster transient response of the DC-DC converters due to smaller coils in small form factor. Furthermore, the present solution allows for optimization of the dynamic efficiency. Furthermore, lower rated chip inductors may be employed. As the present invention is a digital solution the risk is reduced as a mature technology due to the digital architecture can be employed. Moreover, an optimal stacked die with an integrated driver metal-oxide-semiconductor (MOS) allows for high voltage input rails.

Figure 3:
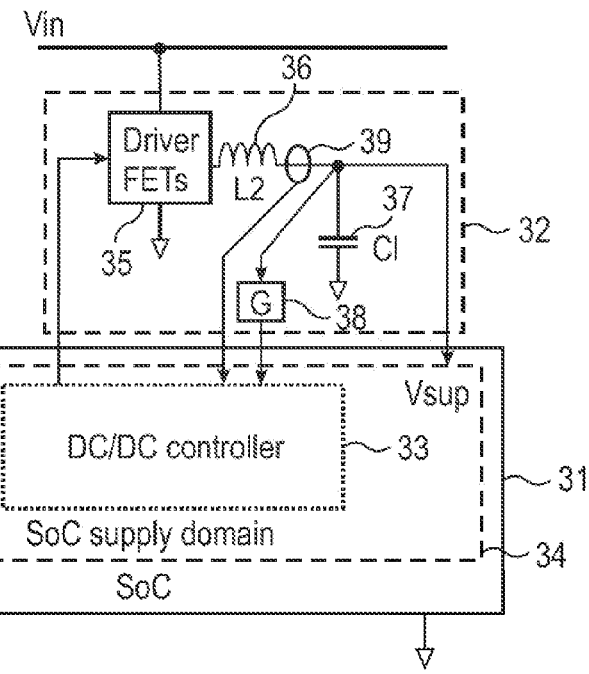
FIG. 3 shows a block diagram of a DC-DC converter for a single phase, single supply domain.

FIG. 3 shows an embodiment of a power converter for powering a SoC 31. The power converter comprises a power stage 32 for generating an output voltage according to a switching signal and input voltage by means of a switching element 35. The power stage further comprises an inductance 36 and a capacitor 37. In a charge phase the capacitor 37 is charged via the inductor 36. In a discharge phase the capacitor 37 is discharged. The switching element 35 is controlled by a controller 33. The controller 33 generates the switching signal according to a control law. The control law may process output voltage and inductor current. The output voltage is provided by means for sensing the output voltage 38 and the inductor current is provided by means for sensing the inductor current 39.

The controller is located on the same chip as the System-on-Chip. The output voltage is generated for powering a supply domain 34 of the System-on-Chip 31. The supply domain 34 comprises the controller 33.

Hence, this embodiment relates to a single phase, single supply domain. As the controller is located on the same chip as the SoC and is powered by a single supply domain of the SoC that again is powered by the same power converter the controller is employed to control, a proprietary power supply of the controller can be omitted.

Figure 4:
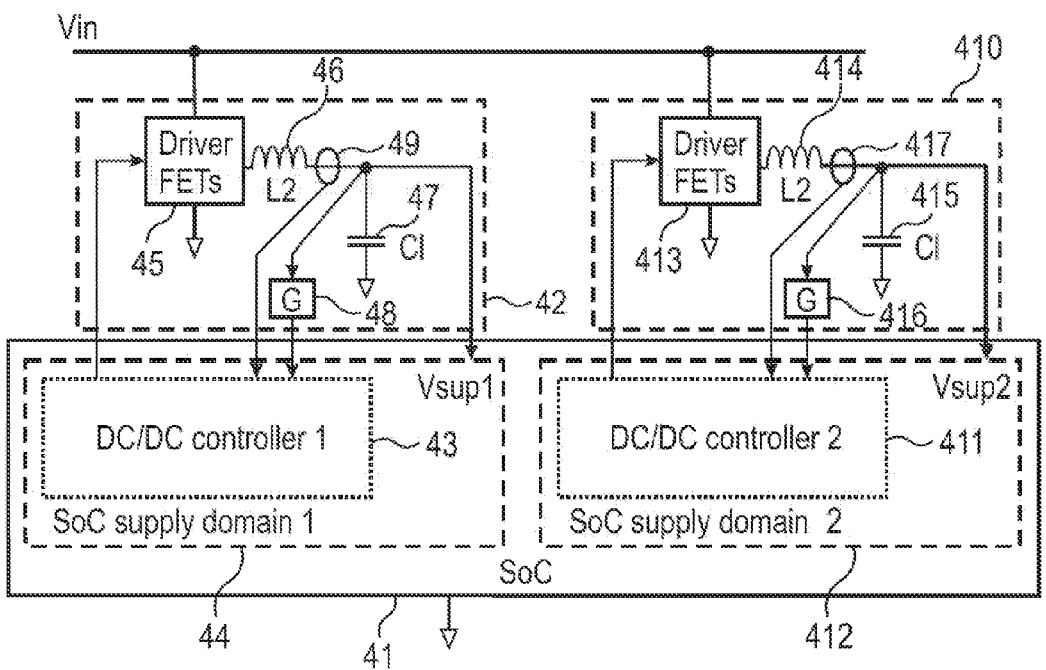
FIG. 4 shows a block diagram of a DC-DC converter for single phase, multiple supply domains.

FIG. 4 shows an embodiment of a power converter for a multi supply domain. The switched power converter comprises a first power stage 42 driven by a first controller 43 for generating a first output voltage Vsup1 and a second power stage 410 driven by a second controller 411 for generating a second output voltage Vsup2. The first controller 43 and the second controller 411 are located on the same chip as the System-on-Chip 21. The first output voltage Vsup1 is generated for powering a first supply domain 44 of the System-on-Chip 41. The second output voltage Vsup2 is generated for powering a second supply domain 412 of the System-on-Chip 41. The first supply domain 44 comprises the first controller 43 and the second supply domain 412 comprises the second controller 411.

The power stages 42, 410 may be identical. The power stages comprise a switching element 45, 413, an inductance 45, 414, a capacitor 47, 415, means for sensing an output voltage 48, 416 and means for sensing an inductor current 49, 417.

The first output voltage and the second output voltage may be in-phase which would correspond to single phase, multi supply domain. Alternatively, first and second output voltage may be out-of-phase.

Figure 5:
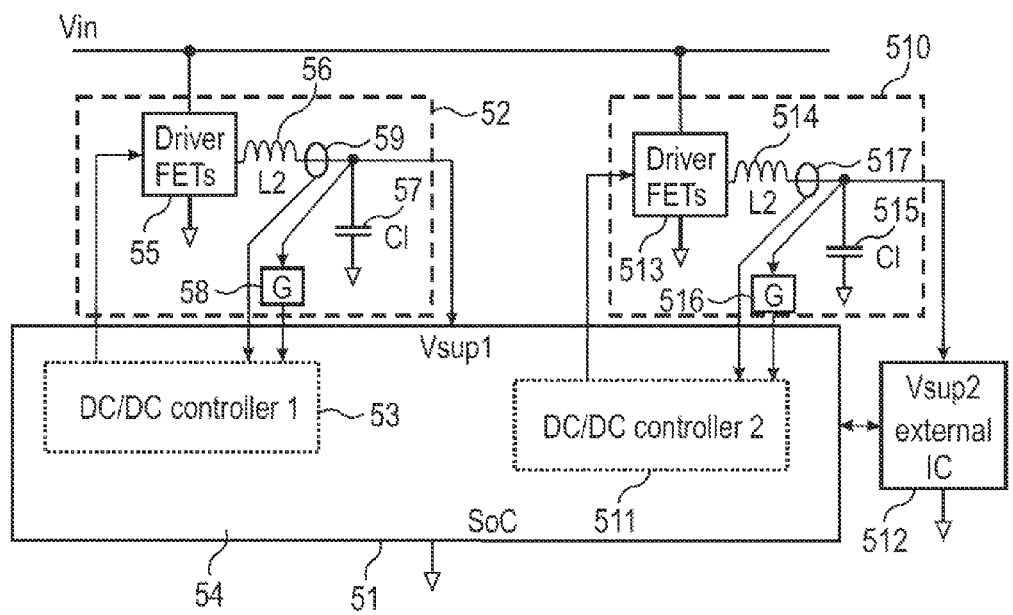
FIG. 5 shows a block diagram of a DC-DC converter for a system power management with DC-DC controller inside master SoC.

FIG. 5 shows another embodiment of power converter for a SoC. The switched power converter comprises a first power stage 52 driven by a first controller 53 for generating a first output voltage Vsup1 and a second power stage 510 driven by a second controller 511 for generating a second output voltage Vsup2.

The first controller 53 and the second controller 511 are located on the same chip as the System-on-Chip 51. The first output voltage Vsup1 is generated for powering a first supply domain 54 of the System-on-Chip 51. The first supply domain comprises the first controller 53 and the second controller 511. The second output voltage is generated for powering a second supply domain 512 outside the System-on-Chip 51. The SoC 51 may be regarded as a master SoC. The second supply domain may belong to a slave Soc or any other integrated circuit external to the master SoC.

The power stages 53, 510 may be identical. The power stages comprise a switching element 55, 513, an inductance 55, 514, a capacitor 57, 515, means for sensing an output voltage 58, 516 and means for sensing an inductor current 59, 517.

Figure 6:
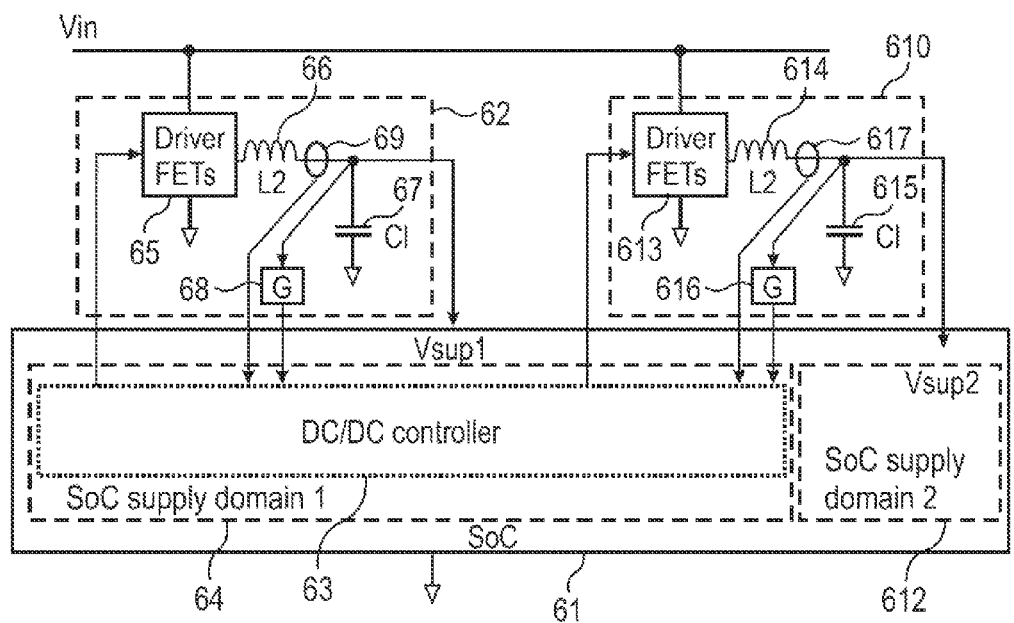
FIG. 6 shows a block diagram of a DC-DC converter with a multi-rail controller inside SoC.

FIG. 6 shows another embodiment of power converter for a SoC. The switched power converter comprises a first power stage 62 for generating a first output voltage Vsup1 and a second power stage 610 for generating a second output voltage Vsup2. The first and second power stages 62, 610 are driven by a single controller 63 that is located on the same chip as the System-on-Chip 61. The first output voltage Vsup1 is generated for powering a first supply domain 64 of the System-on-Chip comprising the single controller 63. The second output voltage Vsup1 is generated for powering a second supply domain 612 of the System-on-Chip.

The power stages 63, 610 may be identical. The power stages comprise a switching element 65, 613, an inductance 65, 614, a capacitor 67, 615, means for sensing an output voltage 68, 616 and means for sensing an inductor current 69, 617.

Figure 7:
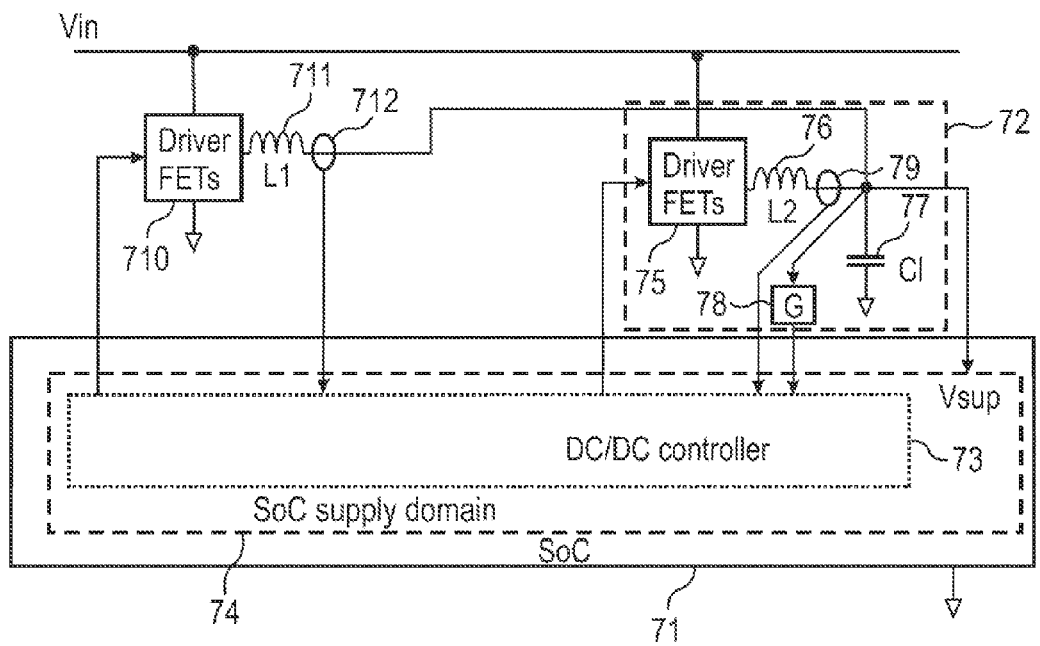
FIG. 7 shows a block diagram of a DC-DC converter with a multi-phase controller inside SoC.

FIG. 7 shows another embodiment of power converter for a SoC. The switched power converter 71 comprises a first power stage 72 for generating an output voltage Vsup and a second power stage coupled to the first power stage such that the first power stage 72 and second power stage comprise a single capacitor 77 that is charged and discharged by the first 71 and second power stage. The first power stage comprises a switching element 75, an inductance 76, the single capacitor 77, means for sensing an output voltage 78 and means for sensing an inductor current 79. The second power stage comprises a switching element 710, an inductance 711, means for sensing an inductor current 79, the single capacitance 77 and the means for sensing an output voltage 78.

The first and second power stages are driven by a controller 73 that is located on the same chip as the System-on-Chip 71. The output voltage Vsup is generated for powering a supply domain 74 of the System-on-Chip 71. The supply domain 74 comprises the controller 73.

Figure 8:
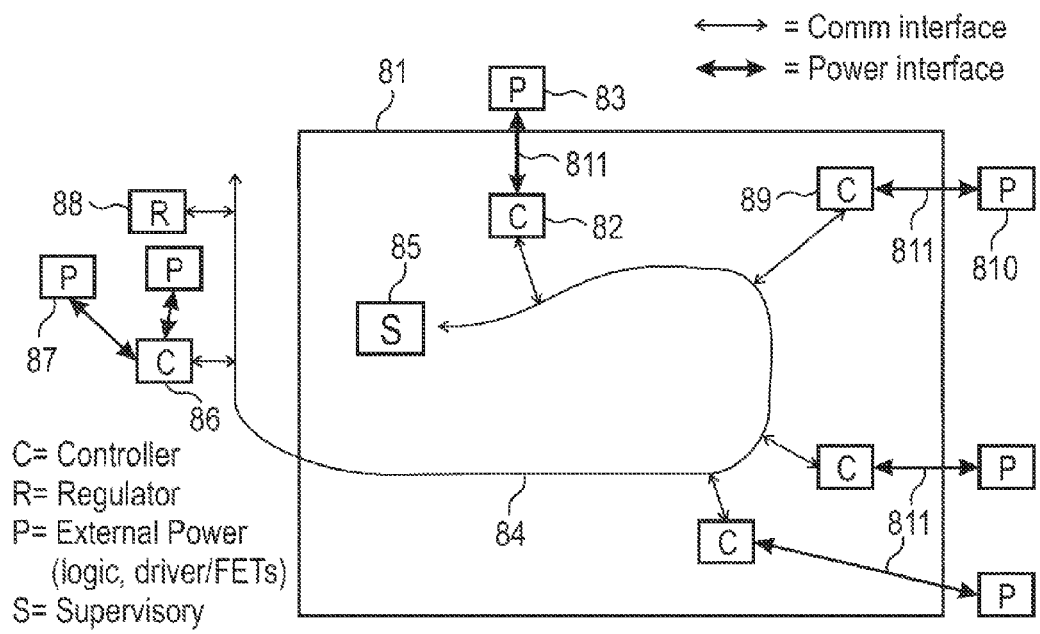
FIG. 8 shows a SoC comprising bi-directional communications for controlling a plurality of DC-DC converters having a controller inside the SoC.

FIG. 8 shows a System-on-Chip comprising a controller 82 for generating a switching signal for driving a switching element of a power stage 83 of a switched power converter, the power stage generating an output voltage according to the switching signal and an input voltage by means of the switching element, wherein the controller 82 is located on the same chip as the System-on-Chip 81 and wherein the output voltage is generated for powering a supply domain of the System-on-Chip. The System-on-Chip further comprises a bidirectional communication bus 84 connecting the controller 82 to another controller of another switched power converter.

The bidirectional communication bus 84 connects the controller 82 to another controller 89 controlling a power stage 810 of another switched power converter. The other controller 89 is located on the same chip as the System-on-Chip 61.

The bidirectional communication bus further connects the controller 82 to another controller 86 controlling a power stage 87 of another switched power converter that is located outside the System-on-Chip 81.

The System-on-Chip 81 further comprises a supervisory controller 85 connected to the bidirectional communication bus 84. The supervisory controller 65 controls whether analog or digital signals generated by a controller 82, 89 on the same chip as the System-on-Chip shall be provided to another controller 86 that is located outside the System-on-Chip.

Furthermore the bidirectional communication bus 84 is connected to a regulator 88.

The controller 82 is connected to a power stage 83 it is controlling by a bidirectional power bus 811.

What is claimed is:

1. System-on-Chip comprising:
a controller for generating a switching signal for driving a switching element of a power stage of a switched power converter, the power stage generating an output voltage according to the switching signal and an input voltage via the switching element, wherein the controller is located on the same chip as the System-on-Chip and wherein the output voltage is generated for powering a supply domain of the System-on-Chip, and wherein the supply domain comprises the controller.

2. System-on-Chip according to claim 1, wherein the supply domain comprises a core and wherein the core is connected to a means for dynamic voltage and frequency scaling, said means for dynamic voltage and frequency scaling being connected to the controller via an on chip control bus.

3. System-on-Chip according to claim 1 comprising a plurality of supply domains, wherein each of the plurality of supply domains comprises a core that is powered by a separate power converter of a plurality of power converters, each power converter being a switched DC-DC converter, wherein each controller is on the same chip as the System-on-Chip and wherein each core is connected to a means for dynamic voltage and frequency scaling, said means for dynamic voltage and frequency scaling being connected to each controller of a power converter of the plurality of power converters via an on chip control bus.

4. The System-on-Chip according to claim 1, wherein the driver is stacked on top of the chip.

5. The System-on-Chip according to claim 1, wherein the driver is an integrated metal-oxide-semiconductor (MOS) stacked on top of the chip.

6. The System-on-Chip according to claim 1, wherein the driver and the power stage of the power converter is implemented as a separate integrated circuit.

7. The System-on-Chip according to claim 1, wherein the driver of the power converter is on the same chip as a plurality of cores.

8. The System-on-Chip according to claim 1, wherein the driver comprises a pulse width modulator generating a PWM signal for switching the switchable power stage and wherein the control signal for controlling the driver is a duty ratio defining a duty cycle of the PWM signal.

9. The System-on-Chip according to claim 1, wherein the driver comprises a pulse width modulator generating a PWM control signal for switching the switchable power stage and wherein the control signal for controlling the driver is a duty ratio defining a duty cycle of the PWM signal wherein the duty ratio and repetition rate is regulated on cycle to cycle bases.

10. The System-on-Chip according to claim 1, wherein the power stage is connected to the core via a power rail, said power rail comprising a chip-interface.

11. The System-on-Chip according to claim 1, wherein the switched power converter comprises a first power stage driven by a first controller for generating a first output voltage and a second power stage driven by a second controller for generating a second output voltage, wherein the first controller and the second controller are located on the same chip as the System-on-Chip and wherein the first output voltage is generated for powering a first supply domain of the System-on-Chip and wherein the second output voltage is generated for powering a second supply domain of the System-on-Chip.

12. The System-on-Chip according to claim 11, wherein the first output voltage and the second output voltage are in-phase or out-of-phase.

13. The System on-Chip according to claim 1, wherein the switched power converter comprises a first power stage driven by a first controller for generating a first output voltage and a second power stage driven by a second controller for generating a second output voltage, wherein the first controller and the second controller are located on the same chip as the System-on-Chip and wherein the first output voltage is generated for powering a first supply domain of the System-on-Chip and wherein the second output voltage is generated for powering a second supply domain outside the System-on-Chip.

14. The System-on-Chip according to claim 12, wherein the first supply domain comprises the first controller and the second controller.

15. The System-on-Chip according to claim 1, wherein the switched power converter comprises a first power stage for generating a first output voltage and a second power stage for generating a second output voltage, wherein the first and second power stages are driven by a single controller that is located on the same chip as the System-on-Chip and wherein the first output voltage is generated for powering a first supply domain of the System-on-Chip comprising the single controller and wherein the second output voltage is generated for powering a second supply domain of the System-on-Chip.

16. The System-on-Chip according to claim 1, wherein the switched power converter comprises a first power stage for generating an output voltage and second power stage coupled to the first power stage such that the first power stage and second power stage comprise a single capacitor that is charged and discharged by the first and second power stage, wherein the first and second power stages are driven by a controller that is located on the same chip as the System-on-Chip, wherein the output voltage is generated for powering a supply domain of the System-on-Chip and wherein the supply domain comprises the controller.

17. The System-on-Chip according to claim 1, further comprising a bidirectional communication bus connecting the controller to another controller of another switched power converter.

18. The System-on-Chip according to claim 17, wherein the bidirectional communication bus connects the controller to another controller of another switched power converter that is located on the same chip as the System-on-Chip.

19. The System-on-Chip according to claim 17, wherein the bidirectional communication bus connects the controller to another controller of another switched power converter that is located outside the System-on-Chip.

20. The System-on-Chip according to claim 17, further comprising a supervisory controller connected to the bidirectional communication bus controlling whether analog or digital signals generated by a controller on the same chip as the System-on-Chip shall be provided another controller that is located outside the System-on-Chip.

21. The System-on-Chip according to claim 16, wherein a controller is connected to a power stage controlled by a bidirectional power bus.

* * * * *